(12) United States Patent
Hsieh

(10) Patent No.: US 8,164,162 B2
(45) Date of Patent: *Apr. 24, 2012

(54) POWER SEMICONDUCTOR DEVICES INTEGRATED WITH CLAMP DIODES SHARING SAME GATE METAL PAD

(75) Inventor: Fu-Yuan Hsieh, Kaohsiung (TW)

(73) Assignee: Force MOS Technology Co., Ltd., Kaohsiung (TW)

( * ) Notice: Subject to any disclaimer, the term of this patent is extended or adjusted under 35 U.S.C. 154(b) by 166 days.

This patent is subject to a terminal disclaimer.

(21) Appl. No.: 12/457,471

(22) Filed: Jun. 11, 2009

(65) Prior Publication Data

US 2010/0314681 A1    Dec. 16, 2010

(51) Int. Cl.
*H01L 29/66*    (2006.01)

(52) U.S. Cl. .......... 257/577; 257/578; 257/E29.201; 257/E21.384; 438/328

(58) Field of Classification Search .......... 257/341, 257/355, 356, 497, 498, 551, 577, 578, 603, 257/605; 438/199, 270
See application file for complete search history.

(56) References Cited

U.S. PATENT DOCUMENTS

| | | | | |
|---|---|---|---|---|
| 4,831,424 A * | 5/1989 | Yoshida et al. | .................. | 257/49 |
| 5,079,608 A * | 1/1992 | Wodarczyk et al. | .......... | 257/355 |
| 5,475,258 A * | 12/1995 | Kato et al. | .................... | 257/603 |
| 5,502,338 A * | 3/1996 | Suda et al. | .................... | 257/570 |
| 5,521,783 A * | 5/1996 | Wolfe et al. | ..................... | 361/56 |
| 5,536,958 A * | 7/1996 | Shen et al. | .................... | 257/356 |
| 5,623,912 A * | 4/1997 | Kelly | ............................. | 123/644 |
| 5,736,779 A * | 4/1998 | Kobayashi | ..................... | 257/603 |
| 5,886,381 A * | 3/1999 | Frisina | ........................ | 257/328 |
| 5,959,345 A * | 9/1999 | Fruth et al. | ................... | 257/605 |
| 5,973,359 A * | 10/1999 | Kobayashi et al. | ........... | 257/328 |
| 6,239,464 B1* | 5/2001 | Tsuchitani et al. | ........... | 257/330 |
| 6,323,518 B1* | 11/2001 | Sakamoto et al. | ............ | 257/330 |
| 6,407,413 B1* | 6/2002 | Kawamoto | .................... | 257/133 |
| 6,413,822 B2* | 7/2002 | Williams et al. | ............. | 438/270 |
| 6,548,865 B2* | 4/2003 | Fujihira et al. | ................ | 257/341 |
| 6,762,440 B1* | 7/2004 | Pairitsch et al. | .............. | 257/173 |
| 6,787,881 B2* | 9/2004 | Letor et al. | .................... | 257/577 |
| 6,855,981 B2* | 2/2005 | Kumar et al. | ................. | 257/328 |
| 6,888,710 B2* | 5/2005 | Mallikarjunaswamy et al. | ................. | 361/56 |
| 6,965,150 B2* | 11/2005 | Higashida et al. | ............ | 257/356 |
| 7,443,225 B2* | 10/2008 | Lui et al. | ....................... | 327/513 |
| 7,511,357 B2* | 3/2009 | Hshieh | .......................... | 257/551 |
| 7,727,831 B2* | 6/2010 | Ohtani | .......................... | 438/199 |
| 7,897,997 B2* | 3/2011 | Hsieh | ............................. | 257/139 |
| 7,902,604 B2* | 3/2011 | Su et al. | ......................... | 257/356 |
| 7,936,014 B2* | 5/2011 | Hsieh | ............................. | 257/341 |
| 2001/0009287 A1* | 7/2001 | Fujihira et al. | ................ | 257/328 |
| 2001/0022525 A1* | 9/2001 | Grimaldi et al. | ............. | 327/384 |
| 2001/0026977 A1* | 10/2001 | Hattori et al. | ................ | 438/268 |
| 2001/0048132 A1* | 12/2001 | Ito et al. | ........................ | 257/330 |

(Continued)

OTHER PUBLICATIONS

Theobald et al., "An Ignition IGBT with Smart Functions in Chip on Chip Technology," Proceedings of 2001 ISPSD, 9.33, pp. 303-306. 2001.*

*Primary Examiner* — William F Kraig
(74) *Attorney, Agent, or Firm* — Bacon & Thomas, PLLC

(57) ABSTRACT

A structure of power semiconductor device integrated with clamp diodes sharing same gate metal pad is disclosed. This improved structure can prevent the degradation of breakdown voltage due to electric field in termination region blocked by polysilicon.

5 Claims, 15 Drawing Sheets

U.S. PATENT DOCUMENTS

| | | | |
|---|---|---|---|
| 2002/0079534 A1* | 6/2002 | Kang et al. | 257/327 |
| 2002/0088991 A1* | 7/2002 | Hisamoto | 257/172 |
| 2003/0107102 A1* | 6/2003 | Ozeki et al. | 257/487 |
| 2004/0262684 A1* | 12/2004 | Fragapane et al. | 257/341 |
| 2006/0113577 A1* | 6/2006 | Ohtani | 257/302 |
| 2008/0179663 A1* | 7/2008 | Terashima | 257/328 |

* cited by examiner

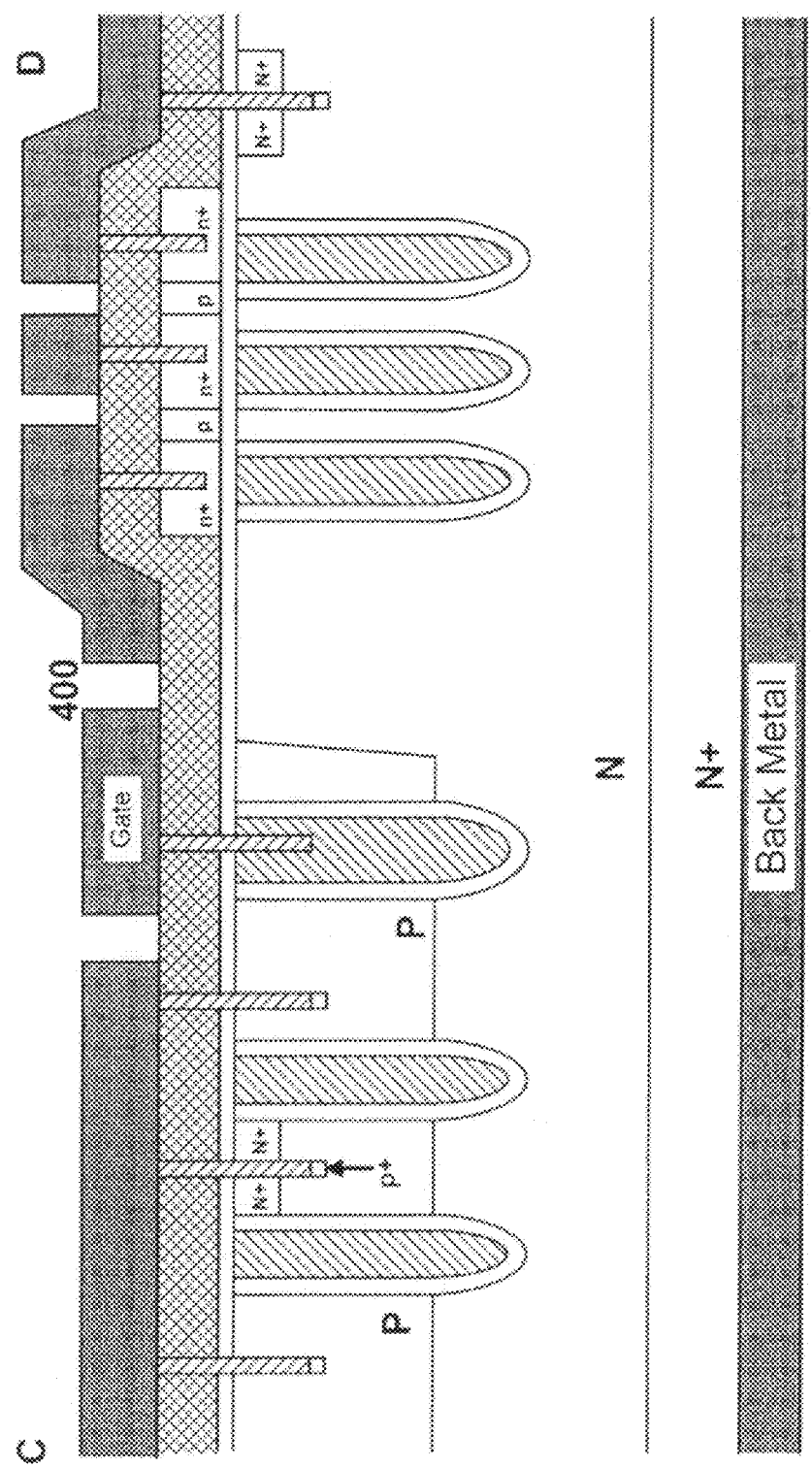

POWER SEMICONDUCTOR DEVICES INTEGRATED WITH CLAMP DIODES SHARING SAME GATE METAL PAD

FIELD OF THE INVENTION

This invention relates generally to the cell structure and device configuration of semiconductor devices. More particularly, this invention relates to an improved device configuration of power semiconductor devices integrated with clamp diodes sharing same gate metal pad.

BACKGROUND OF THE INVENTION

In order to enhance avalanche capability, clamp diodes are formed between Gate and Drain for MOSFET and between Gate and Collector for IGBT, respectively. However, breakdown voltage degradation in main devices may be introduced while forming this integrated configuration in prior art if the clamp diodes are made on a polysilicon layer placed across the edge termination. The interaction between the electric fields in the polysilicon clamp diodes and edge termination may significantly degrade breakdown voltage of the main devices.

FIG. 1 is a circuit diagram of a MOSFET with gate-drain clamp diodes and FIG. 2 is the cross section view of a MOSFET of prior art (U.S. Pat. No. 5,631,187) where the cell is formed on N substrate 200. On the top surface of the substrate 200, there is an N+ source region 210 surrounded by a P body region 211. A metal layer 220 makes electrical contact to both said N+ source region 210 and P body region 211 acting as a source electrode. Meanwhile, metal layer 222 and 221 are deposited to function as a gate electrode and a drain electrode of the cell structure, respectively. Between the gate electrode and drain electrode, a serial of back-to-back polysilicon diodes 230 are formed across over the termination to enhance the avalanche capability of the semiconductor power device.

The prior art discussed above is encountering a technical difficulty which is that, as the gate-drain (or gate-collector for IGBT) clamp diode crosses over termination, a problem of breakdown voltage degradation will be arisen due to electric field in termination region is blocked by polysilicon.

Accordingly, it would be desirable to provide a new and improved device configuration to prevent the degradation of breakdown voltage from happening.

SUMMARY OF THE INVENTION

It is therefore an object of the present invention to provide a new and improve device configuration to solve the problem discussed above.

One advantage of the present invention is that, gate-drain clamp diodes and gate-source clamp diodes of MOSFET (or gate-collector clamp diodes and gate-emitter clamp diodes of IGBT) share same gate metal pad, as shown in FIG. 3A (or FIG. 3B for IGBT) of circuit Diagrams and FIG. 4 of top view. The first gate metal pad 550 in FIG. 4 located inside of the metal field plate ring area 552 is connected directly to trench gate of MOSFET (IGBT) or through a resistor (not shown). The first gate metal pad 550 is also connected to source metal 553 (or emitter metal for IGBT) through a gate-source clamp diode 554 of MOSFET (or gate-emitter clamp diode for IGBT) and the metal field plate 552 as gate metal runner as well. The second gate metal pad 551 located outside of edge termination including the metal field plate ring area 552 is connected to drain of MOSFET (or collector of IGBT) through a gate-drain clamp diode 555 (or gate-collector clamp diode for IGBT). The second gate metal pad is connected to the first gate metal pad through metal stripe with metal gap between two adjacent metal stripes, as shown in FIGS. 5A and 5B which is the C-D cross section view and E-F cross section view of FIG. 4, respectively. The metal gap 400 allows electrical field in the termination area out of epitaxial surface. There will be no degradation in breakdown voltage due to no polysilicon clamp diodes crossing over the edge termination.

Briefly in a preferred embodiment according to the present invention, as shown in FIG. 6, which is also the A-B cross section view of FIG. 4, the present invention discloses a trench MOSFET device formed on a substrate heavily doped with a first semiconductor doping type, e.g., N+ doping type. Onto said substrate, grown an N epitaxial layer and a plurality of trenches were etched wherein. Doped poly was filled within a plurality of trenches over a gate oxide layer along the inner surface of said trenches to serve as trench gates. Especially, the trench gates underneath contact trenches of gate-drain clamp diodes and gate-source clamp diodes are employed to prevent shortage may caused by over etching of contact trenches. Near the top surface of P-body regions, N+ source regions are formed between two adjacent trench gates. A thick oxide interlayer is deposited over epitaxial layer, as well as over the top surface and sidewalls of a doped polysilicon layer comprising multiple back to back Zener diodes which composed of alternated doping areas of a first semiconductor doping type next to doping areas of a second semiconductor doping type. Through the thick oxide interlayer, source-body contact trenches, gate contact trenches and drain contact trenches are etched into epitaxial layer for source-body connection, gate connection and drain connection, respectively. Around the bottom of these contact trenches, a p+ contact area is formed. Especially, N+ contact regions are implanted near the bottom of the drain contacts trenches to further reduce the contact resistance. Meanwhile, other contact trenches are etched into cathodes of the Zener diodes for the formation of gate-drain clamp diodes and gate-source clamp diodes. To fill these contact trenches, a barrier layer and tungsten material are deposited and then etched back to act as metal plug. The first gate metal pad 550 and the second gate metal pad 551 is deposited to contact one electrode of gate-source clamp diodes and gate-drain clamp diodes via trench contacts etched into Zener diodes, respectively. At the same time, source metal is deposited to contact another electrode of gate-source clamp diodes with source region and body regions; drain metal is deposited to contact the other electrode of gate-drain clamp diodes with drain region. In termination area, gate metal runner which also serving as metal field plate is formed overlying P-body and top surface of epitaxial layer which connects both two said gate metal pads together. The gate-drain clamp diode as shown in FIG. 6 is located outside of termination and has no gate metal or polysilicon cross over the edge termination, therefore resulting in no degradation in breakdown voltage which occurred in the prior art.

Briefly in another preferred embodiment according to the present invention, as shown in FIG. 7, which also shows the A-B cross section view of FIG. 4, the trench MOSFET structure disclosed is similar to the structure in FIG. 6 except that there is a deep guard ring under said metal field plate in termination area.

Briefly in another preferred embodiment according to the present invention, as shown in FIG. 8, which also shows the A-B cross section view of FIG. 4, the trench MOSFET structure disclosed is similar to the structure in FIG. 6 except that there are n* regions in top surface of said epitaxial layer next to P-body region as termination and there are n* regions having higher doping concentration than the epitaxial layer underneath trench bottom for Rds reduction.

Briefly in another preferred embodiment according to the present invention, as shown in FIG. 9, which also shows the A-B cross section view of FIG. 4, the trench MOSFET structure disclosed is similar to the structure in FIG. 8 except that there is a deep guard ring under said metal field plate in termination area.

Briefly in a preferred embodiment according to the present invention, as shown in FIG. 10, which is also the A-B cross section view of FIG. 4. The present invention discloses a trench IGBT device formed on a substrate heavily doped with a second semiconductor doping type, e.g., P+ doping type. Onto said substrate, grown a heavily doped epitaxial layer with a first semiconductor doping type, e.g., N+ doping type, onto which a second epitaxial layer lightly doped with the same first doping type is formed, and a plurality of trenches were etched wherein. Doped poly was filled within a plurality of trenches over a gate oxide layer along the inner surface of said trenches to serve as trench gates. Especially, the trench gates underneath contact trenches of gate-collector clamp diodes and gate-emitter clamp diodes are employed to prevent shortage may caused by over etching of contact trenches. Near the top surface of P-body regions, N+ emitter regions are formed between two adjacent trench gates. A thick oxide interlayer is deposited over front surface of epitaxial layer, as well as over the top surface and sidewalls of doped polysilicon layer comprising multiple back to back Zener diodes which composed of alternated doping areas of a first semiconductor doping type next to doping areas of a second semiconductor doping type. Through the thick oxide interlayer, emitter-base contact trenches, gate contact trenches and collector contact trenches are etched into the second epitaxial layer for emitter-base connection, gate connection and collector connection, respectively. Around the bottom of these contact trenches, a p+ contact area is formed. Especially, N+ contact regions are implanted near the bottom of the collector contacts trenches to further reduce the contact resistance. Meanwhile, other contact trenches are etched into cathodes of the Zener diodes for the formation of gate-collector clamp diodes and gate-emitter clamp diodes. To fill these contact trenches, a barrier layer and tungsten material are deposited and then etched back to act as metal plug. The first gate metal pad and the second gate metal pad is deposited to contact one electrode of gate-collector clamp diodes and gate-emitter clamp diodes via trench contacts etched into Zener diodes, respectively. At the same time, emitter metal is deposited to contact another electrode of gate-emitter clamp diodes with emitter region and base regions; collector metal is deposited to contact the other electrode of gate-collector clamp diodes with collector region. In termination area, gate metal runner which also serving as metal field plate is formed overlying P-body and top surface of epitaxial layer which connects both two said gate metal pads together and there is a deep guard ring and a floating ring under said metal field plate under said metal field plate as termination.

Briefly in another preferred embodiment according to the present invention, as shown in FIG. 11, which also shows the A-B cross section view of FIG. 4, the trench NPT IGBT device disclosed is similar to the structure in FIG. 10 except that the device is built on a lightly doped N substrate and P+ is formed on rear side of the N substrate after backside grinding.

Briefly in another preferred embodiment according to the present invention, as shown in FIG. 12B, which also shows the A-B cross section view of FIG. 4, the present invention discloses a trench NPT IGBT device with gate-collector diode, gate-emitter diode and collector shorting diode sharing same gate metal pad. FIG. 12A shows a circuit diagram that illustrates the implementation of gate-emitter clamp diode, gate-collector clamp diode and collector shorting diode with IGBT device. The trench NPT IGBT device disclosed is similar to the structure in FIG. 11 except the collector comprising alternated P+ and N+ regions.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein:

FIG. 5A is a side cross-sectional view of a trench MOSFET along C-D axis marked in FIG. 4.

DETAILED DESCRIPTION OF THE EMBODIMENTS

Figure 1:
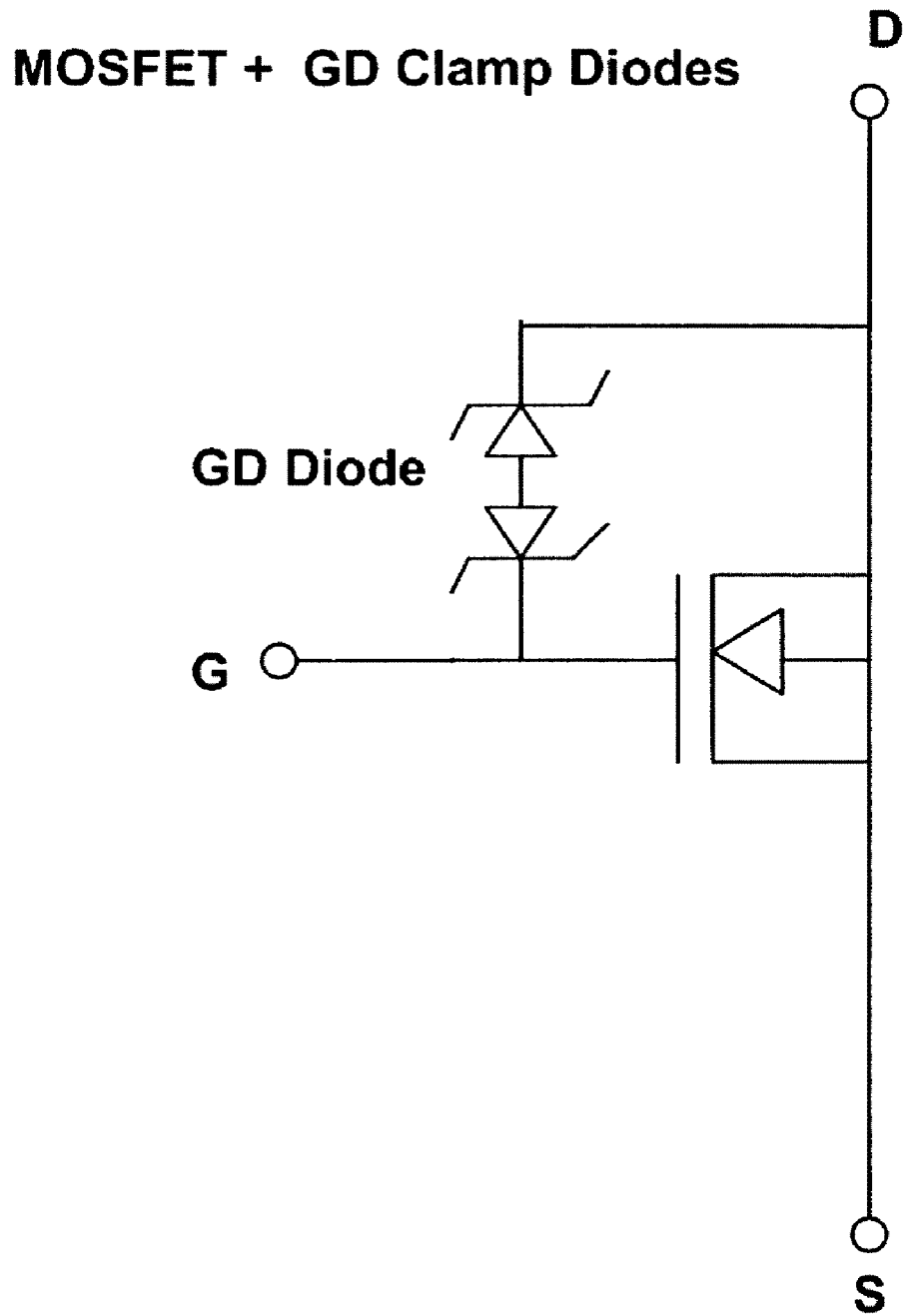
FIG. 1 is a circuit diagram illustrates the implementation of a MOSFET cell with gate-drain clamp diodes of prior art.
Figure 2:
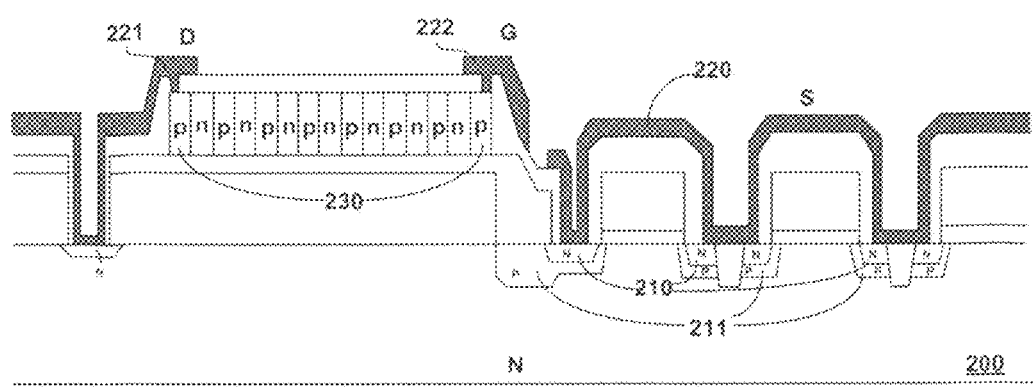
FIG. 2 is a side cross-sectional view of prior art shown in FIG. 1.
Figure 3A:
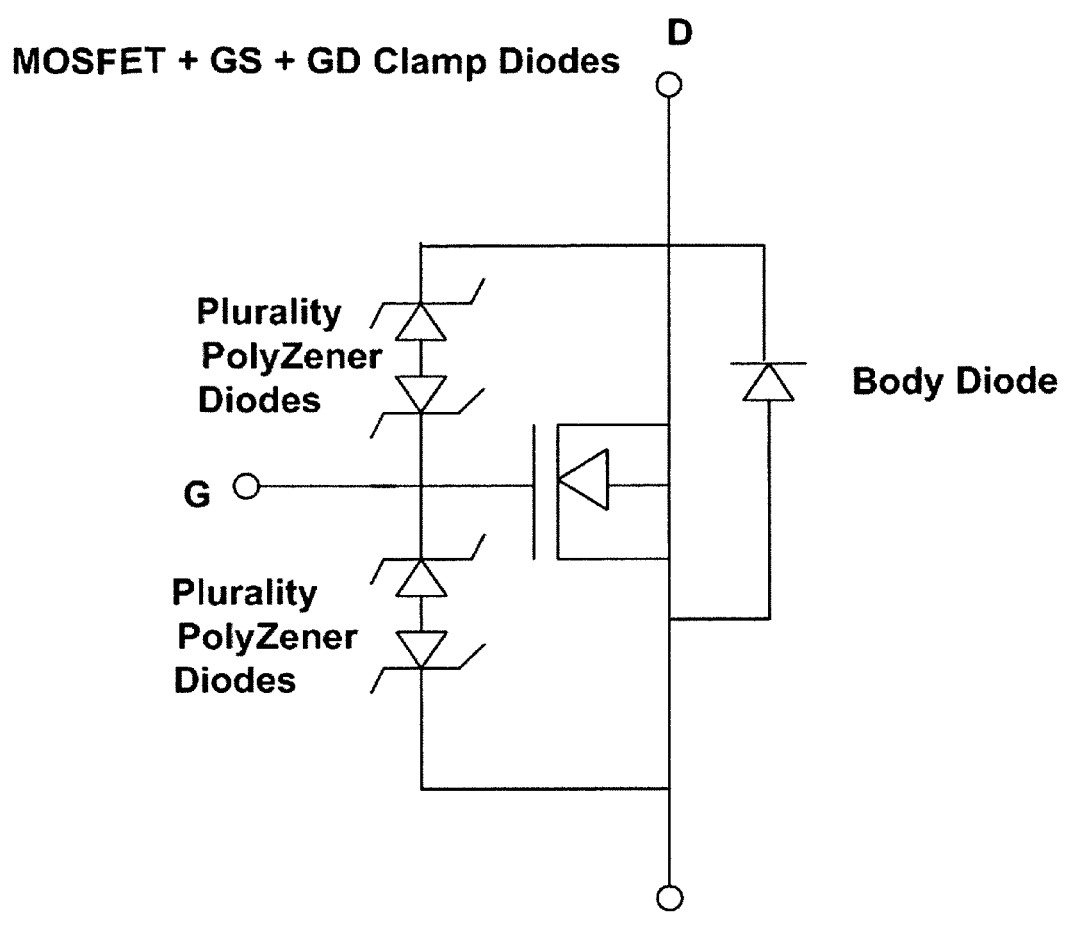
FIG. 3A is a circuit diagram that illustrates the implementation of a MOSFET cell with gate-drain clamp diodes and gate-source clamp diodes of this invention.
Figure 3B:
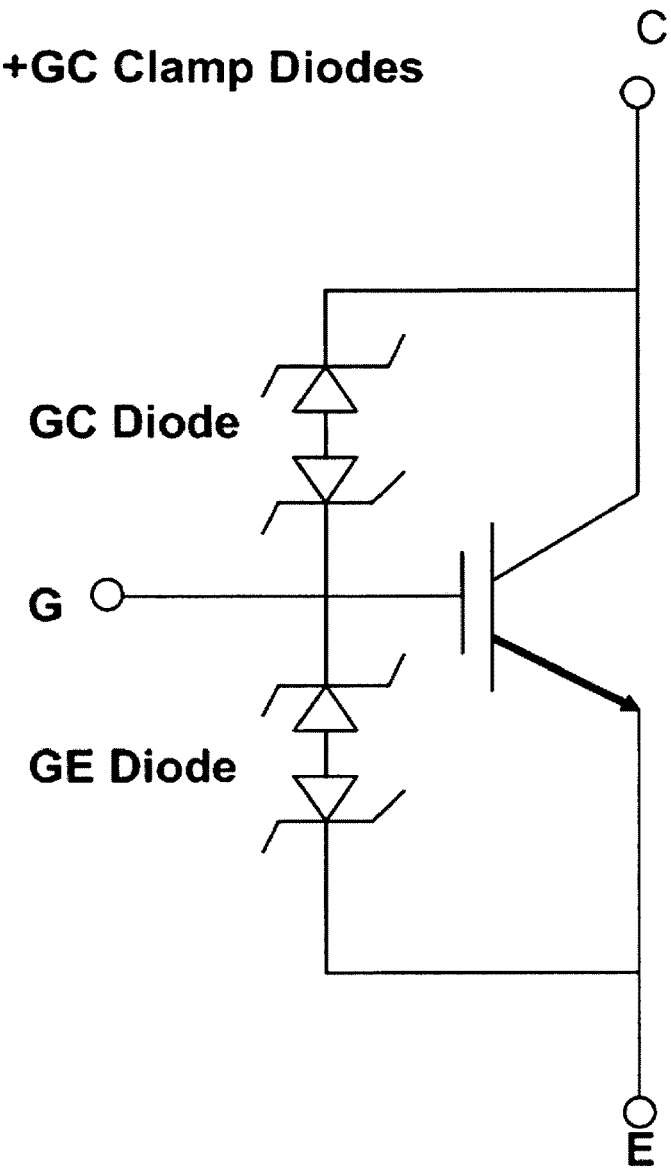
FIG. 3B is a circuit diagram that illustrates the implementation of an IGBT cell with gate-emitter clamp diodes and gate-collector clamp diodes of this invention.
Figure 4:
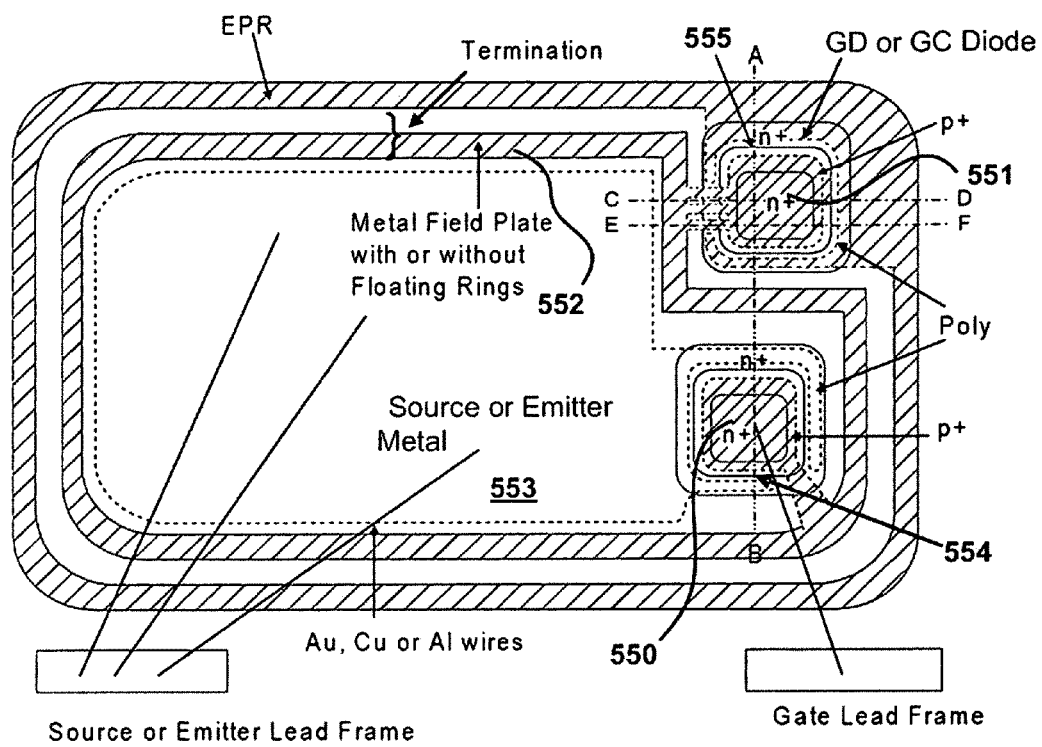
FIG. 4 is top view of this invention.
Figure 5B:
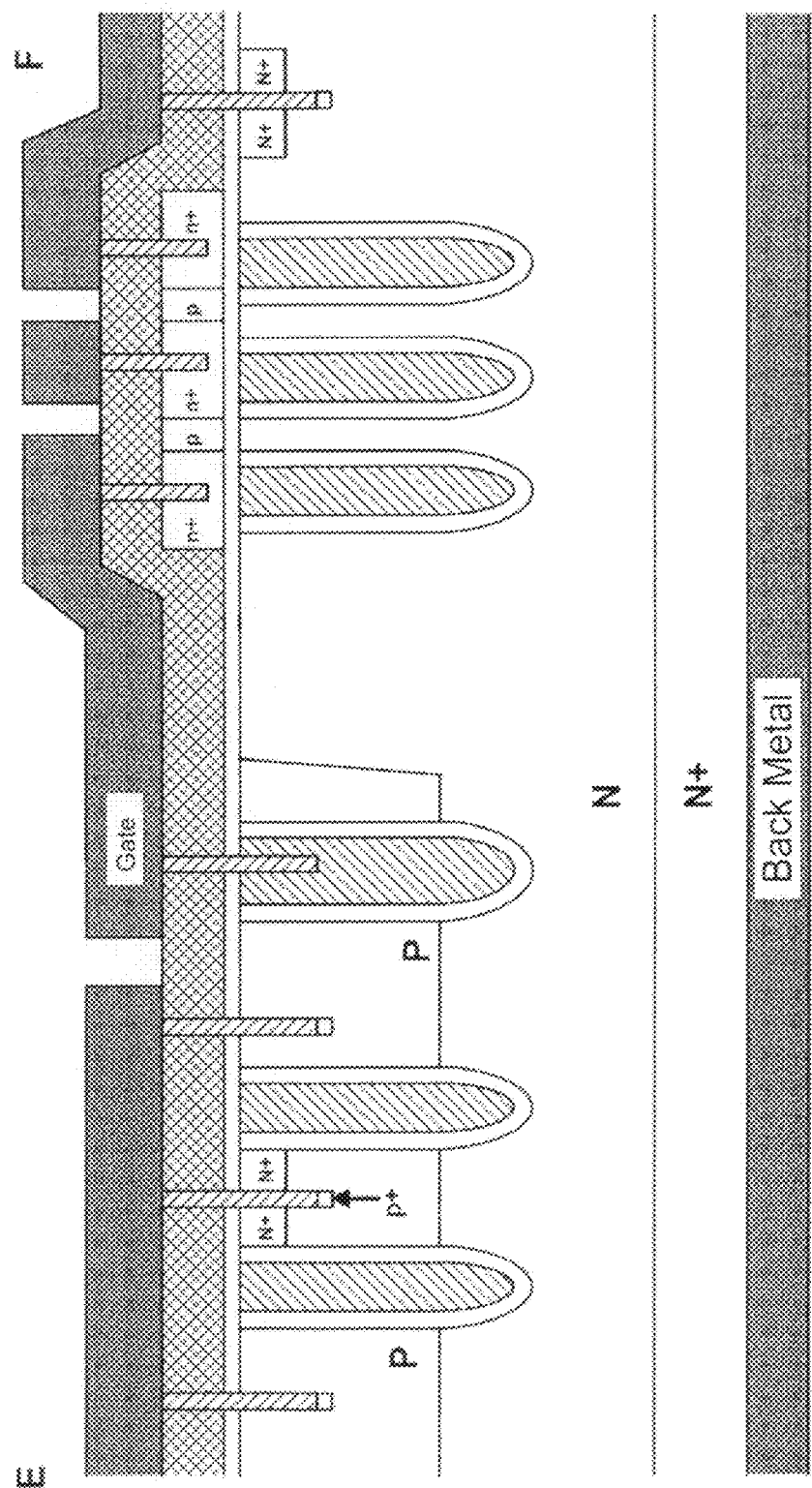
FIG. 5B is a side cross-sectional view of a trench MOSFET along E-F axis marked in FIG. 4.
Figure 6:
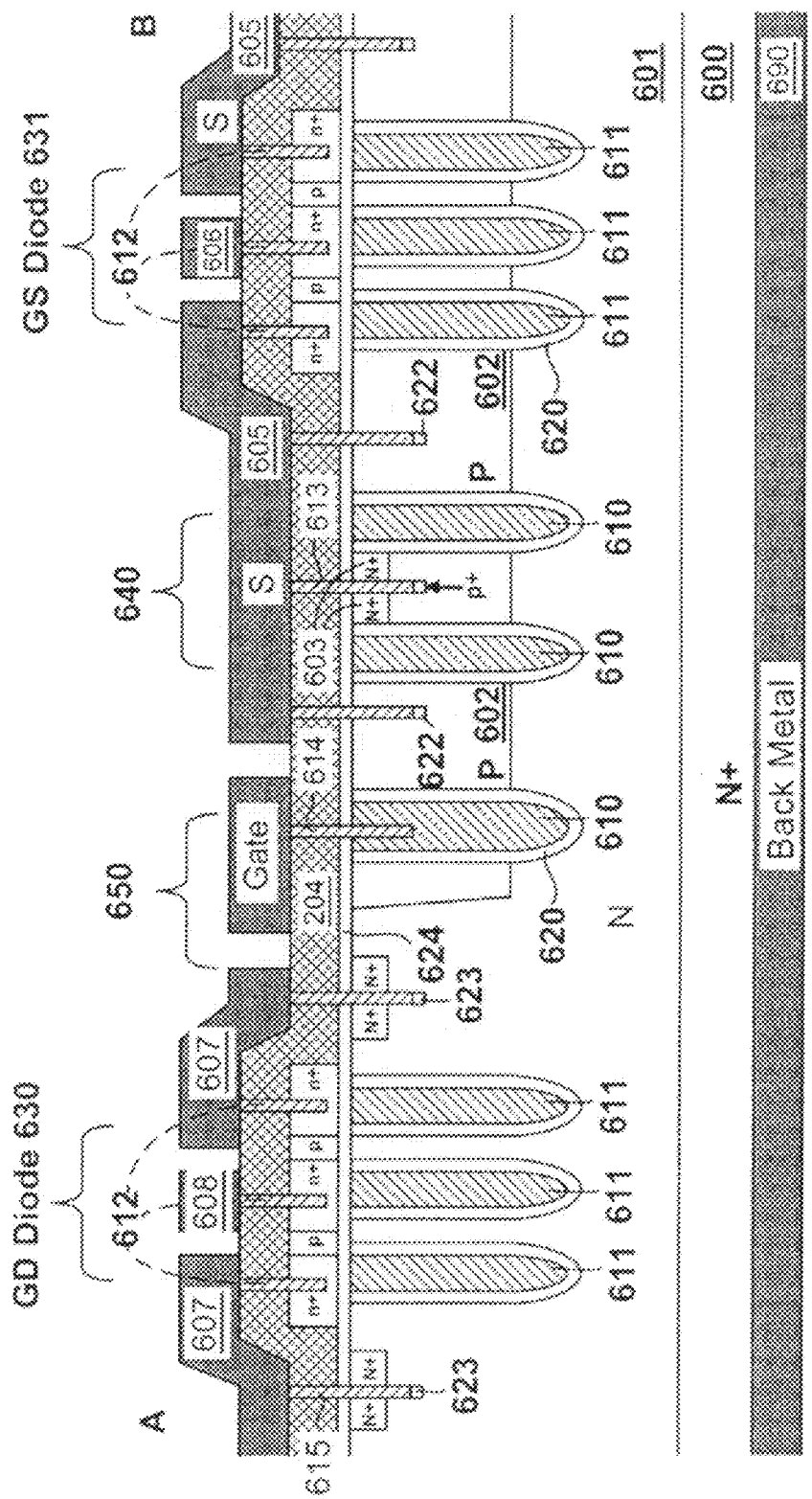
FIG. 6 is a side cross-sectional view of a trench MOSFET along A-B axis marked in FIG. 4 of a preferred embodiment according to the present invention.

Please refer to FIG. 6 for a preferred embodiment of this invention showing the A-B cross section of FIG. 4 where a trench MOSFET device cell integrated with gate-drain and gate-source clamp diodes is formed on a heavily N+ doped substrate 600 coated with back metal 690 on rear side as drain electrode. Onto the substrate 200, a lighter N doped epitaxial layer 601 is grown, and a plurality of trenches is etched wherein. Doped poly is filled into the trenches padded with a gate insulation layer 620 formed over the inner surface of said trenches. Within these gate trenches filled with doped poly, gate trenches 611 underneath contact trenches 612, disconnected from trench gates 610 in active area are formed to prevent shortage may caused by over etching of contact trenches 612. P-body regions 602 are extending between every adjacent trench gates 610 with N+ source region 603 near the top surface only within active area 640. Trench source-body contacts 613 filled with tungsten plug are formed penetrating through a thick oxide interlayer 604 and source region 603, and extending into P-body region 602, and surrounded with p+ contact area 622 underneath each source-body contact bottom to contact source region 603 and P-body region 602 with source metal 605. Trench gate contacts 614 filled with the tungsten plugs are formed penetrating through the thick oxide interlayer 604 and extending into the trench gates 610 to connect the trench gates 610 with gate metal. Trench drain contacts 615 filled with tungsten plug are formed penetrating through said oxide interlayer and source region 603, and extending into the epitaxial layer 601 to connect drain region with drain metal 607. There are gate-drain clamp diodes 630 above an oxide layer 624 between the second gate metal pad 608 and drain metal 607, and gate-source clamp diodes 631 above said oxide layer 624 between the first gate metal pad 606 and source metal 605. In termination area 650, gate metal runner which also serving as metal field plate is formed overlying P-body region 602 and top surface of epitaxial layer 601 which connects both two said gate metal pads together.

Figure 7:
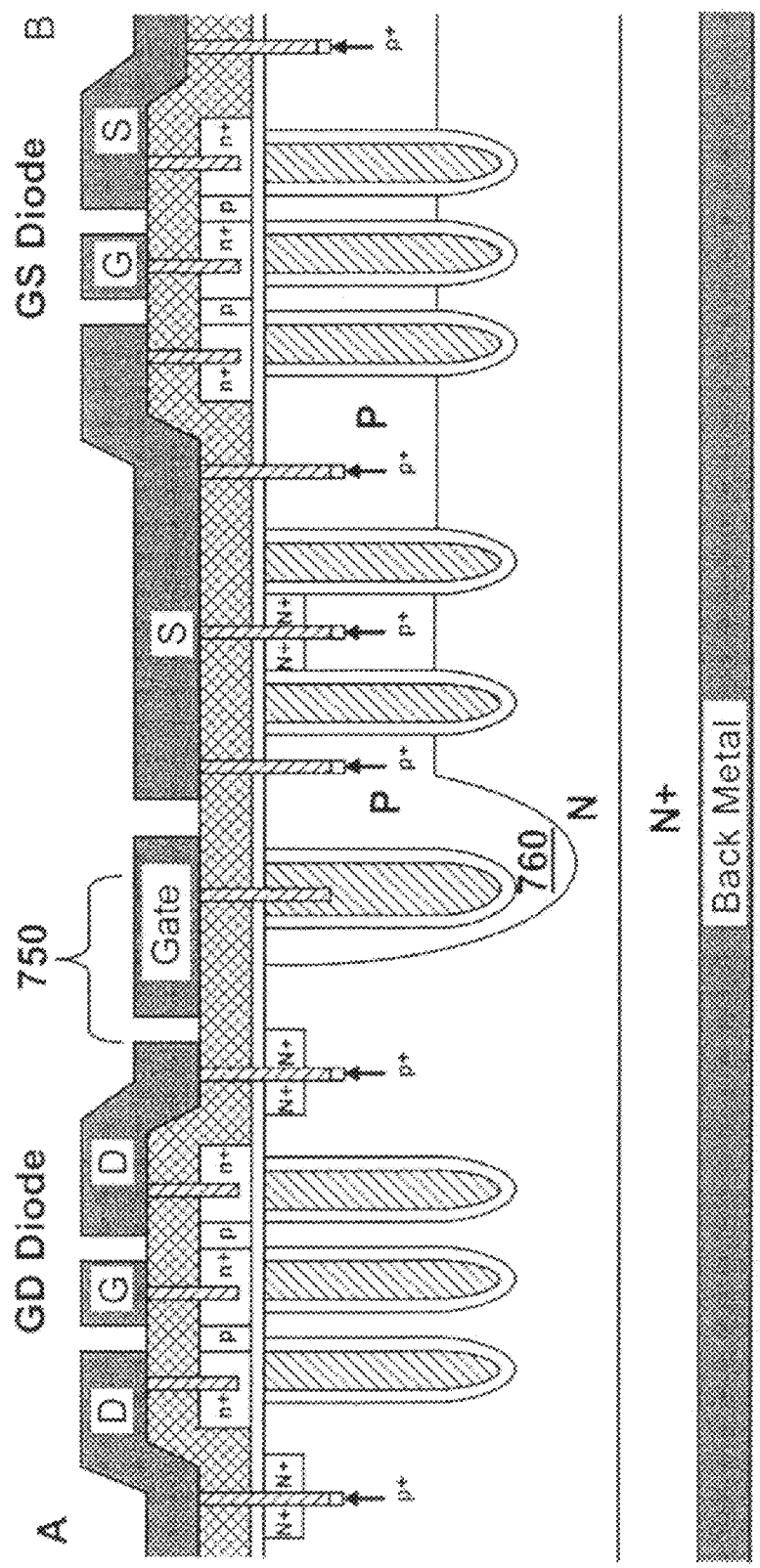
FIG. 7 is a side cross-sectional view of a trench MOSFET along A-B axis marked in FIG. 4 of another preferred embodiment according to the present invention.

Please refer to FIG. 7 for another preferred embodiment of this invention showing the A-B cross section of FIG. 4 where the trench MOSFET structure disclosed is similar to the structure in FIG. 6 except that there is a deep guard ring 760 under the said metal field plate in termination area 750.

Figure 8:
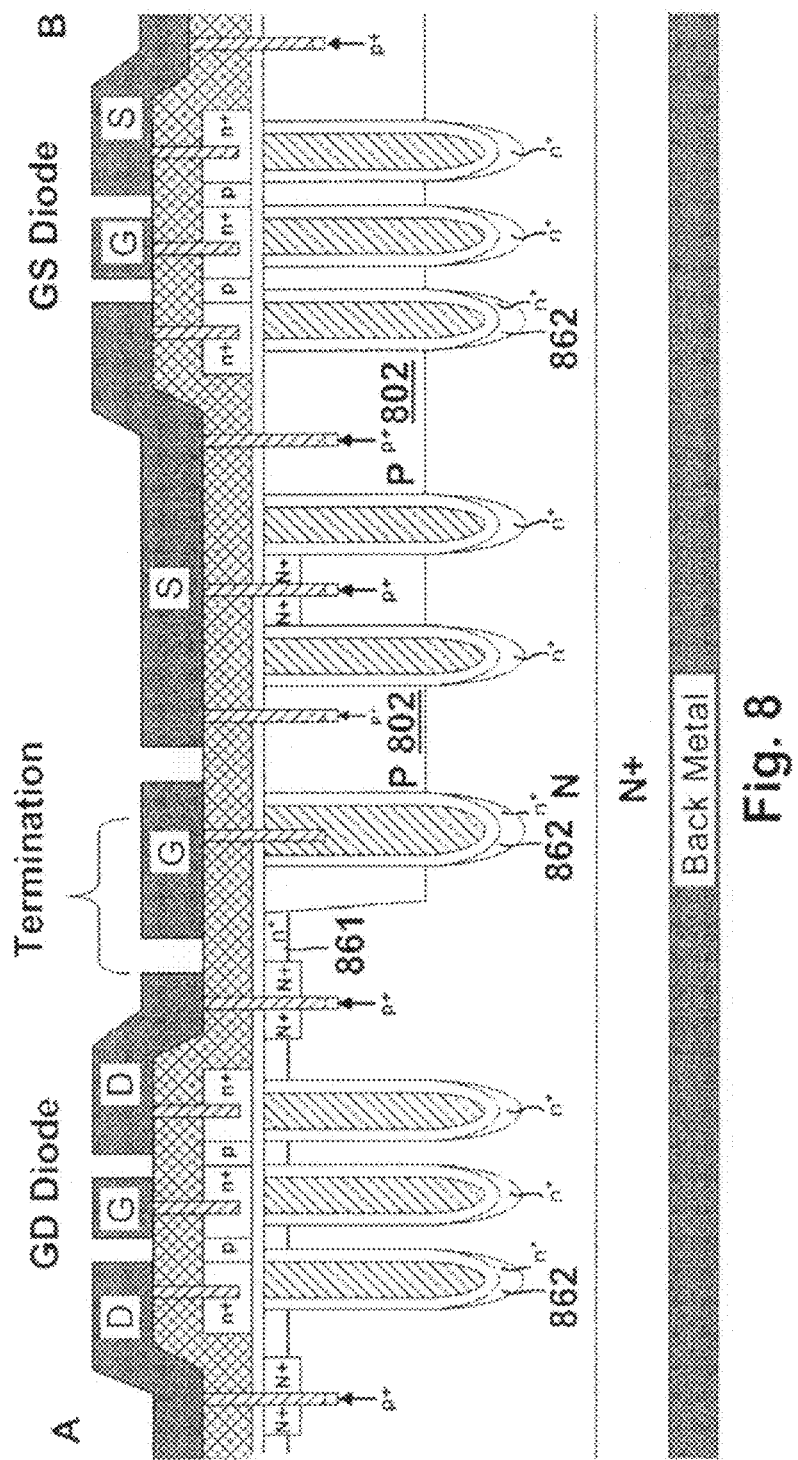
FIG. 8 is a side cross-sectional view of a trench MOSFET along A-B axis marked in FIG. 4 of another preferred embodiment according to the present invention.

Please refer to FIG. 8 for another preferred embodiment of this invention showing the A-B cross section of FIG. 4 where the trench MOSFET structure disclosed is similar to the structure in FIG. 6 except that there are n* regions 861 in top surface of said epitaxial layer next to P-body region 802 as termination and there are n* regions 862 having higher doping concentration than the epitaxial layer underneath trench bottom for Rds reduction.

Figure 9:
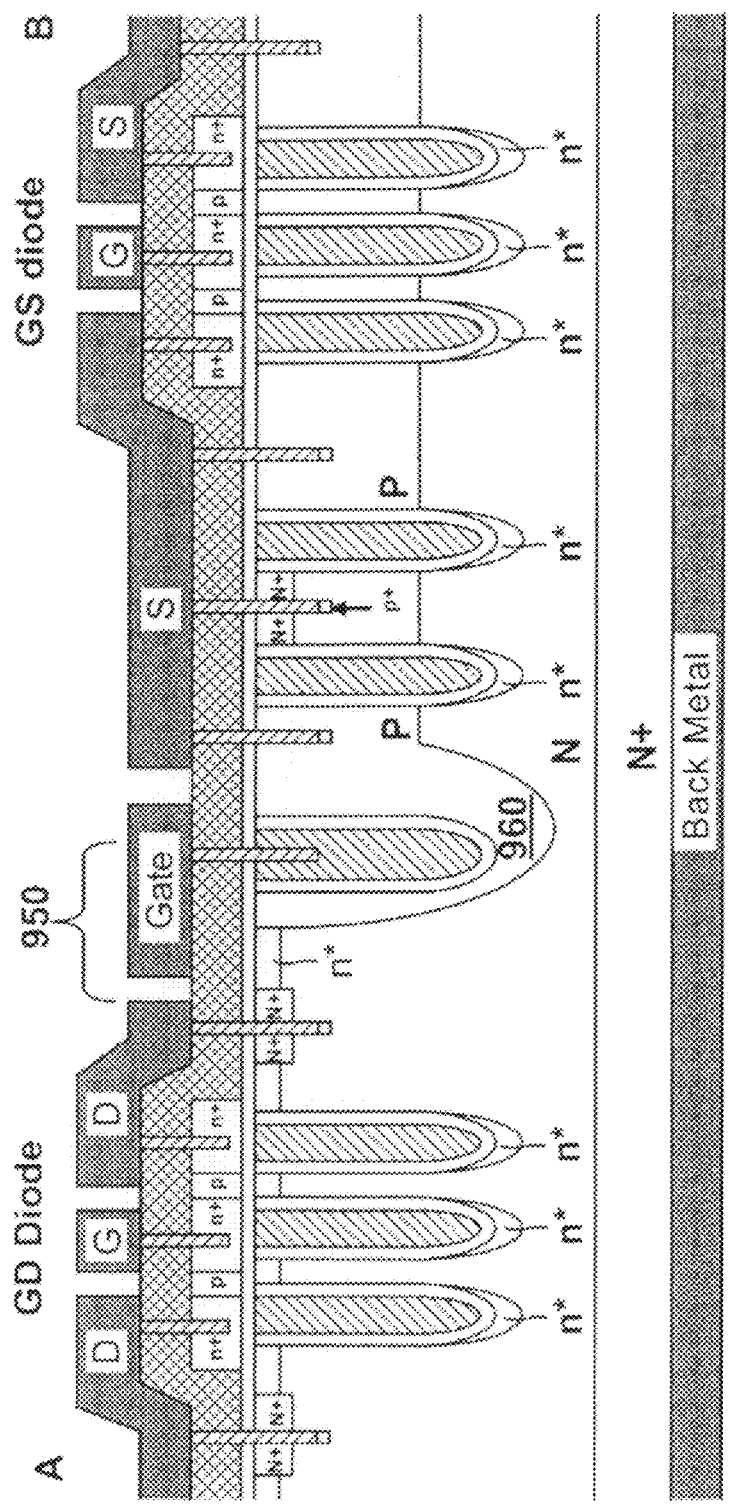
FIG. 9 is a side cross-sectional view of a trench MOSFET along A-B axis marked in FIG. 4 of another preferred embodiment according to the present invention.

Please refer to FIG. 9 for another preferred embodiment of this invention showing the A-B cross section of FIG. 4 where the trench MOSFET structure disclosed is similar to the structure in FIG. 8 except that there is a deep guard ring 960 under said metal field plate in termination area 950.

Figure 10:
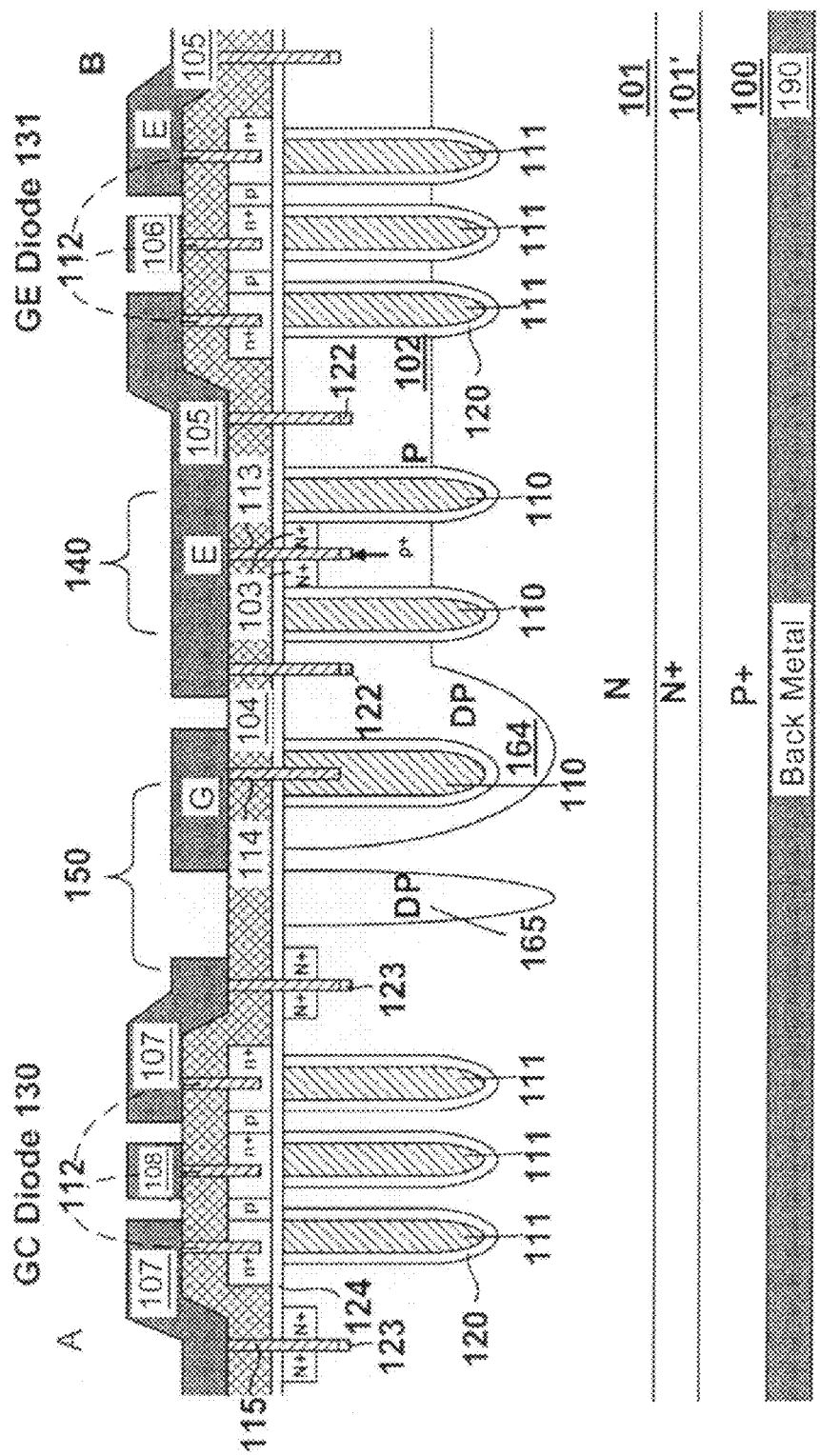
FIG. 10 is a side cross-sectional view of a trench PT IGBT along A-B axis marked in FIG. 4 of another preferred embodiment according to the present invention.

Please refer to FIG. 10 for a preferred embodiment of this invention showing the A-B cross section of FIG. 4 where a trench PT (Punch-through) Type IGBT device cell integrated with gate-collector and gate-emitter clamp diodes is formed on a heavily P+ doped substrate 100 coated with back metal 190 on rear side as collector electrode. Onto said substrate 100, a heavily N+ doped epitaxial layer 101' and a lightly N doped epitaxial layer 101 are successively grown, and a plurality of trenches are etched wherein. Doped poly is filled into the said trenches padded with a gate insulation layer 120 formed over the inner surface of said trenches. Within these gate trenches filled with doped poly, gate trenches 111 underneath contact trenches 112 are formed to prevent shortage may caused by over etching of contact trenches 112. P-base regions 102 are extending between every adjacent trench gates 110 with N+ emitter region 103 near the top surface only within active area 140. Trench emitter-base contacts filled with tungsten plug 113 are formed penetrating through a thick oxide interlayer 104 and emitter region 103, and extending into P base region 102, and surrounded with p+ contact area 122 underneath each emitter-base contact bottom to contact the emitter region 103 and the P-base region 102 with emitter metal 105. Trench gate contacts 114 filled with the tungsten plug are formed penetrating through said oxide interlayer 104 and extending into trench gates 110 to connect the trench gates 110 to gate metal. Collector contacts 115 filled with tungsten plug are formed penetrating through said oxide interlayer and emitter region 103, and extending into the epitaxial layer 101 to connect collector region with collector metal 107. There are gate-collector clamp diodes 130 above an oxide layer 124 between the second gate metal pad 108 and collector metal 107, and gate-emitter clamp diodes 131 above said oxide layer 124 between the first gate metal pad 106 and emitter metal 105. In termination area 150, gate metal runner which also serving as metal field plate is formed overlying P-body region 102 and top surface of epitaxial layer 101 which connects both two said gate metal pads together and there is a deep guard ring 164 and a floating ring 165 under said metal field plate under said metal field plate as termination.

Figure 11:
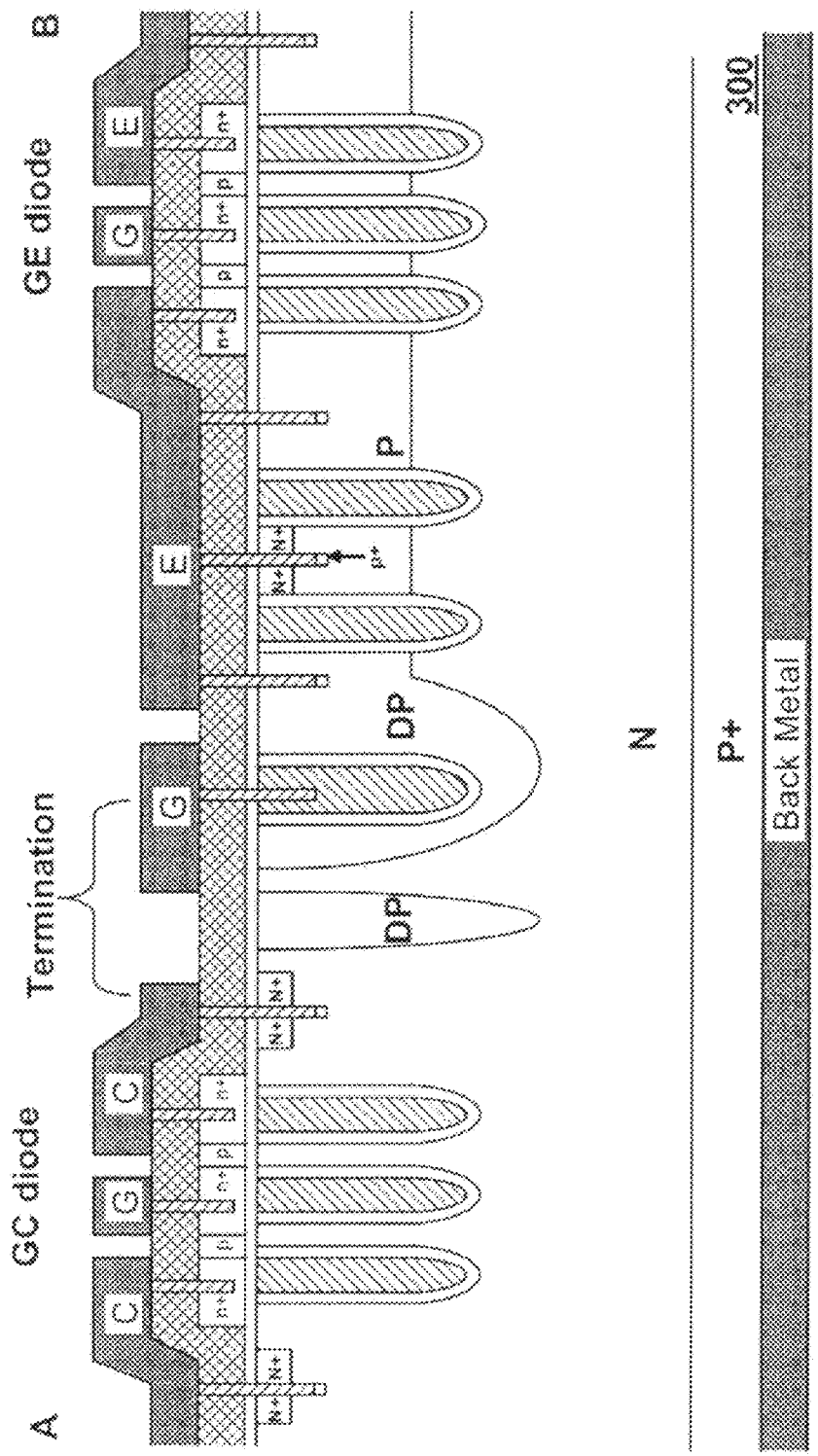
FIG. 11 is a side cross-sectional view of a trench NPT IGBT along A-B axis marked in FIG. 4 of another preferred embodiment according to the present invention.

Please refer to FIG. 11 for another preferred embodiment of this invention showing the A-B cross section of FIG. 4 where trench NPT (Non-punch-through) type IGBT structure disclosed is similar to the structure in FIG. 10 except that the device is built on a lightly doped N substrate and P+ region 300 is formed on rear side of the N substrate after backside grinding.

Figure 12A:
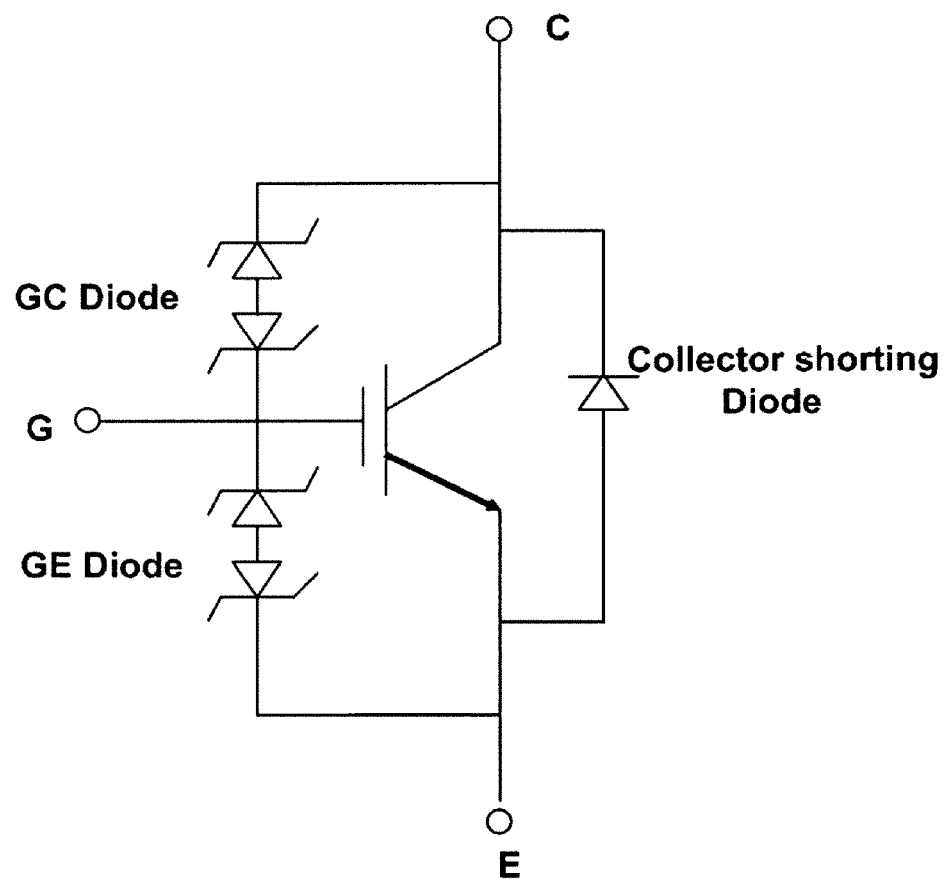
FIG. 12A shows a circuit diagram that illustrates the implementation of an IGBT cell with gate-emitter clamp diode, gate-collector clamp diode and collector shorting diode of this invention.
Figure 12B:
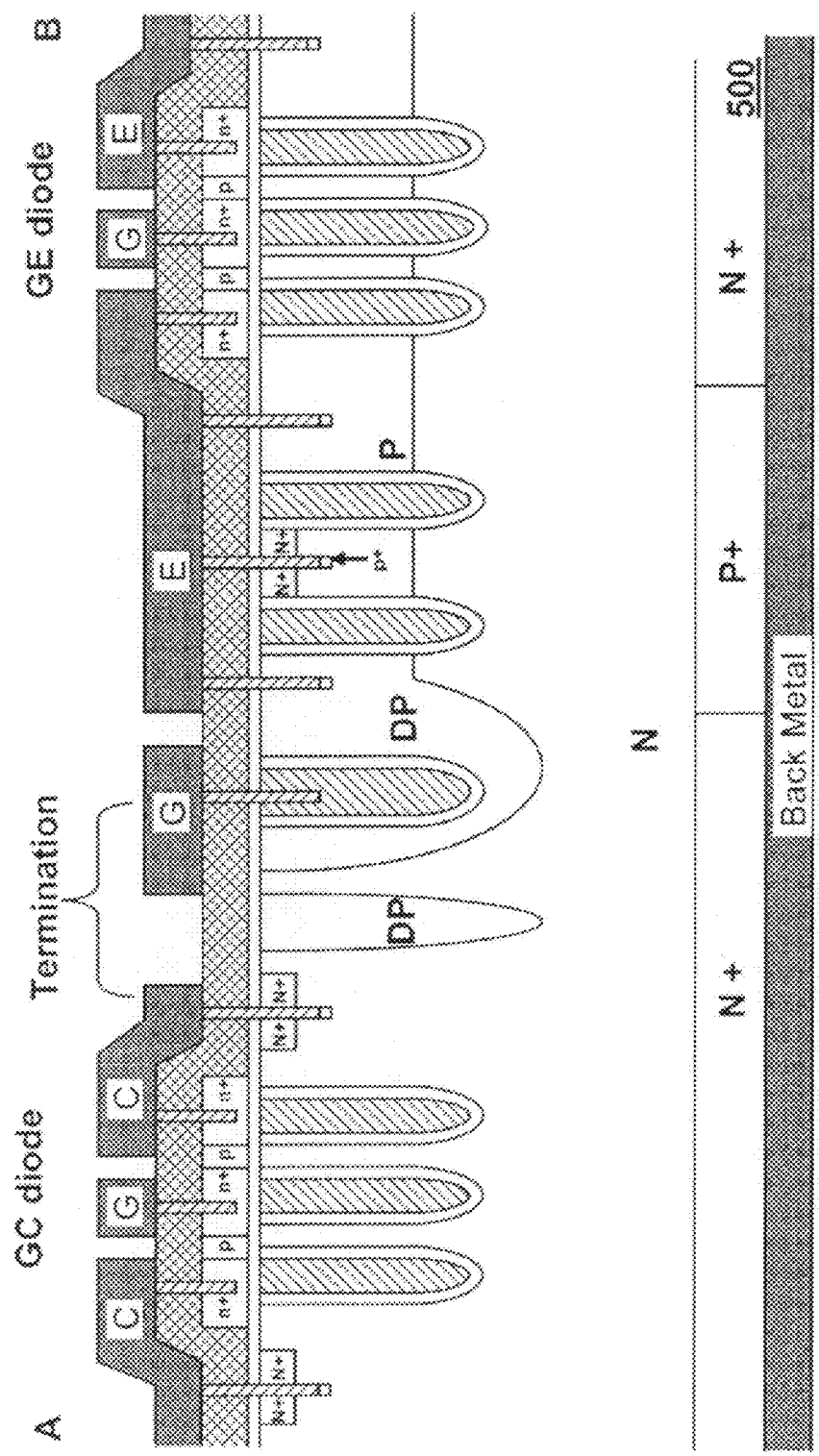
FIG. 12B is a side cross-sectional view of a trench NPT IGBT along A-B axis marked in FIG. 4 of another preferred embodiment according to the present invention shown in FIG. 12A.

FIG. 12A shows a circuit diagram that illustrates the implementation of an IGBT cell with gate-emitter clamp diode, gate-collector clamp diode and collector shorting diode. Please refer to FIG. 12B for another preferred embodiment of this invention showing the A-B cross section of FIG. 4 where the trench NPT IGBT device disclosed is similar to the structure in FIG. 11 except the collector comprising alternated P+ and N+ regions on the rear side of the lightly doped N substrate.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A vertical semiconductor power IGBT device comprising a plurality of trenched gates in a silicon layer surrounded by emitter regions with a first type conductivity in active area encompassed in base regions with a second type conductivity, further comprising:

a first insulating layer serving as a gate oxide lining an inner surface of openings for said trenched gates;

a second insulating layer functioning as a thick oxide interlayer;

a plurality of trench emitter-base contacts filled with a barrier layer and tungsten plugs;

an emitter metal layer connected to the emitter regions and the base regions via said trench emitter-base contacts;

a gate-emitter clamp diode connected between a first gate metal and said emitter metal layer, composed of multiple back-to-back Zener diodes disposed inside of an edge termination area;

a gate-collector clamp diode connected between a second gate metal and a first collector metal, composed of multiple back-to-back polysilicon Zener diodes disposed outside of said edge termination area without having said polysilicon zener diodes or said second gate metal cross over said edge termination area;

said first collector metal connected to a front side of said silicon layer via a trench collector contact filled with said barrier layer and another tungsten plug;

a second collector metal layer formed on a back side of said silicon layer, and said first and second gate metals connected together through multiple metal stripes with metal gap between two adjacent metal stripes.

2. The IGBT of claim 1, wherein said IGBT is a PT IGBT formed in the front side of said silicon layer, said silicon layer being comprised of a substrate heavily doped with said second type conductivity, a first epitaxial layer grown on said substrate and doped with said first type conductivity, and a second epitaxial layer grown on said first epitaxial layer and doped with said first type conductivity, having a doping concentration lower than said first epitaxial layer.

3. The IGBT of claim 1, wherein said IGBT is a NPT IGBT form in the front side of said silicon layer, said silicon layer being comprised of a lightly doped substrate with said first type conductivity, wherein the back side of said lightly doped substrate is heavily doped with said second type conductivity.

4. The IGBT of claim 1, wherein said IGBT is a NPT IGBT formed in the front side of said silicon layer, said silicon layer being comprised of a lightly doped substrate with said first type conductivity, wherein the back side of said lightly doped substrate is alternately heavily doped with said first and second type conductivity to provide an integrated collector shorting diode with the IGBT device.

5. The IGBT of claim 1, wherein a gate metal runner also serving as a metal field plate is deposited over a deep guard ring in said edge termination area.

* * * * *